May 5, 1970 G. B. POTTER 3,510,735

TRANSISTOR WITH INTEGRAL PINCH RESISTOR

Filed April 13, 1967 2 Sheets-Sheet 1

INVENTOR:
Gene B. Potter

By Smyth, Roston & Pavitt

ATTORNEYS

INVENTOR:
Gene B. Potter
By Smyth, Roston & Pavitt
ATTORNEYS

United States Patent Office 3,510,735
Patented May 5, 1970

3,510,735
TRANSISTOR WITH INTEGRAL PINCH RESISTOR

Gene Barrack Potter, Woodland Hills, Calif., assignor to Scientific Data Systems, Inc., a corporation of Delaware Filed Apr. 13, 1967, Ser. No. 630,616
Int. Cl. H01l *15/00*
U.S. Cl. 317—235 22 Claims

ABSTRACT OF THE DISCLOSURE

A junction transistor with an integrated circuit type base resistor functioning also as a diode or as a distributed auxiliary transistor between the base current input terminal and the collector so that excess current bypasses the base and the transistor is driven to about saturation to eliminate the storage time problem.

The present invention relates to a new transistor. Transistors, individually or as components in an integrated circuit unit, are today the standard type active circuit element used as switching element for digital circuits. The increasing speed for operation of digital circuits requires a critical evaluation of the properties of the transistor concerning high speed responses. Here it becomes of interest that two opposing conditions are imposed upon the transistor design. One condition or constraint involves reliability of the response of a transistor. This is usually obtained by controlling the transistor always well into saturation. Thus, even if the controlling input voltage varies, the transistor can be caused to saturate if normally the transistor is highly overdriven. The output signal in the conductive state of the transistor will still be constant even if the input level varies. The switching states of the transistor are thus well defined states: complete cutoff and saturation, so that throughout an extended circuit system one can rely on fixed signal levels for the outputs of several transistors.

As stated, in order to assure this type of behavior of the transistor, it is thus necessary and desirable to overdrive it. For example, if the transistor is controlled in the emitter circuit configuration then the switching or control pulse or signal applied to the base circuit causes the base current to flow at a level higher than needed to establish saturation of the collector current. This requirement originating in the general principle of reliability is, however, detrimental to the transistor as far as frequency of operation is concerned. The obvious case which is the physical destruction of the transistor due to excess current can, of course, be excluded, as this is a mere constraint on the degree of overdriving the transistor. However, a transistor which is being run at saturation and which is being overdriven (without destruction) still will accumulate in its base zone a rather dense concentration of minority charge carriers. This excess of minority charge carriers in the base zone is not detrimental for the transistor operation during conduction. However, upon removing the control voltage and current from the base, these minority charge carriers have to be dissipated, which becomes noticeable externally as a continued collector current flow. Necessarily the delay time (storage time) required to dissipate these charge carriers has to be taken into consideration as an operating delay because it introduces a delay inbetween the instant defined by the removal of the control pulse from the transistor input and the transmission of that pulse flank or trailing edge through the transistor to be effective in its collector or emitter output circuit.

It is an object of the present invention to provide a new and improved transistor in which the input voltage applied to its base can have the character of an overdriving signal without, however, causing this excessive accumulation of minority charge carriers because the transistor will just barely saturate and, therefore, the storage time will be considerably reduced. The transistor in accordance with the present invention can be constructed as an individual circuit element, but the general configuration can also be used in an integrated circuit unit whereby it is emphasized that the structure of the transistor itself involves to some extent integrated circuit techniques.

The transistor in accordance with the invention is constructed in that the base zone is made somewhat larger than necessary if that base zone were only to provide for separation among the PN junctions which the base zone forms with the collector and the emitter zones. This extension of the base zone, however, does not extend the diffusion path for minority charge carriers as between the emitter and collector zones; that extension is, so to speak, lateral to the diffusion path. The collector zone has an accordingly extended portion. The base zone, at least in that extended portion, is provided with a gradient of the impurities determining the particular conductivity type of the base zone, with a decreasing concentration towards the PN junction with the collector zone. The base current is now supplied to the extension of the base zone, remote from the emitter zone but in the vicinity of that portion of the PN junction formed by the extended base zone with the extended collector zone. Specifically, for example, another region or zone of the same conductivity type as the emitter and collector zones, establishes a pinch effect resistor in that base zone. This resistor is part of the base zone and forms an extended PN junction with the extended collector zone of the transistor and thus constitutes a bypass diode for the transistor proper, which diode, however, is contiguous with the base-collector diode of the transistor. All of the several zones have exposed surfaces, exposed as far as the external boundary of the semiconductor body is concerned of which these zones are a part. These exposed surfaces are, however, to a substantial degree, covered with electrode layers making ohmic, i.e., non-rectifying contact therewith.

The control current for the base of the transistor is applied to the particular electrode layer and lead-in contacting the extended base zone so that the current path to the base zone proper must run through the pinch resistor, i.e., the region having a very low conductivity. That current also runs along the PN junction between the extended base zone and the extended collector zone. During saturation of the transistor, the collector-base junction is biased in the forward direction so that the potential along that resistor can only slightly exceed the forward voltage across the adjacent extended base collector junction. This, in turn, limits the current through the pinch resistor and into the base zone proper while the larger part of the control current is bled off across the PN junction between extended base zone and collector zone, towards the collector zone. The base current has thus value to drive the transistor just at saturation while the excess or overdrive current bypasses the base zone proper, and no, or very few, excess minority charge carriers will accumulate in the base zone. It has been found that the storage time can be reduced by this means by about one order of magnitude.

The portion of the extended base zone receiving the externally applied base current, the zone establishing the pinch resistor which is of opposite type conductivity and the collector zone of the principal transistor establish a second, distributed transistor.

If the base zone and the zone establishing the pinch resistor are externally interconnected, the distributed transistor is turned on to the extent excess base current has to be bled off.

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

Figure 1:
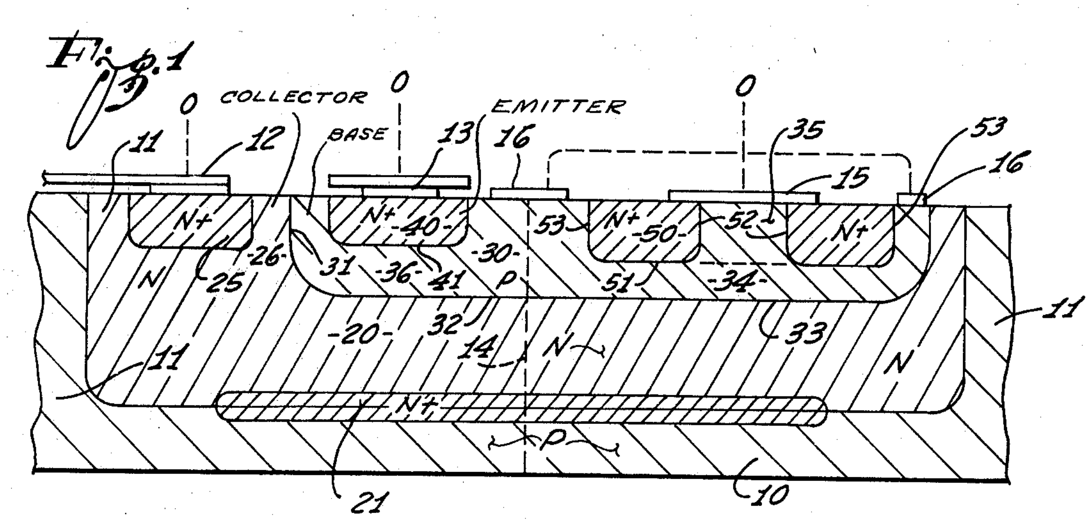
FIG. 1 illustrates a schematic cross-section through a transistor in accordance with the invention whereby it is assumed that it is a portion of an integrated circuit chip, the vertical dimensions having been distorted relative to the horizontal dimensions for convenience of representation.
Figure 2:
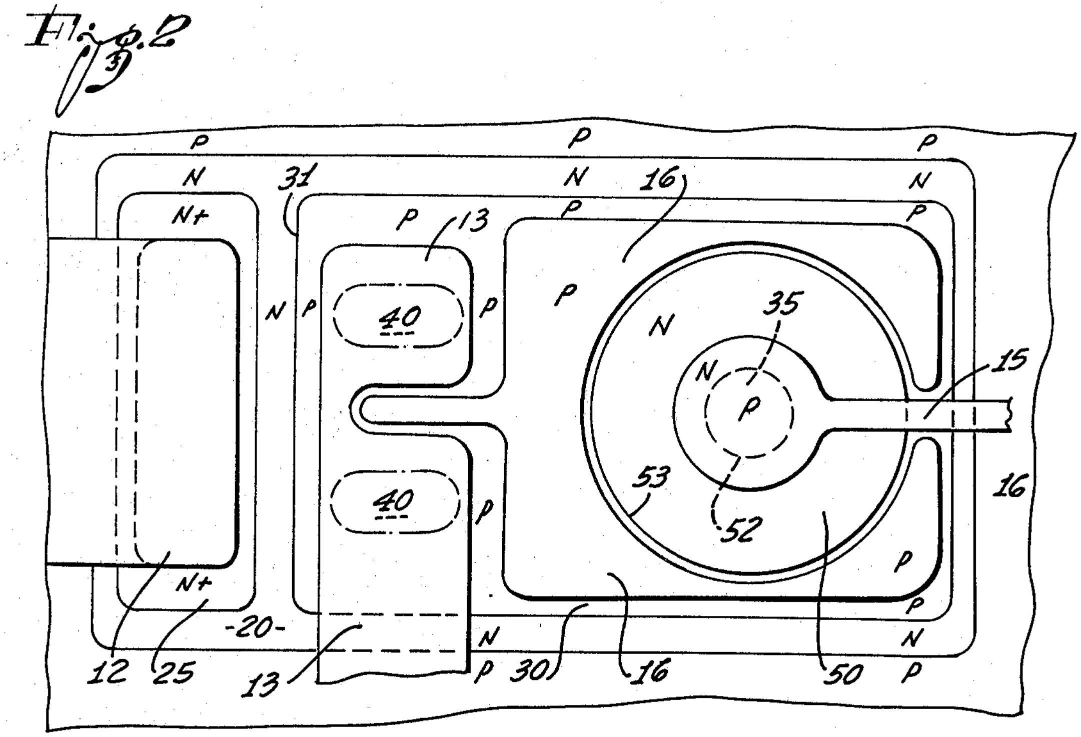
FIG. 2 illustrates a top view of the transistor shown in principle in FIG. 1.
Figure 3:
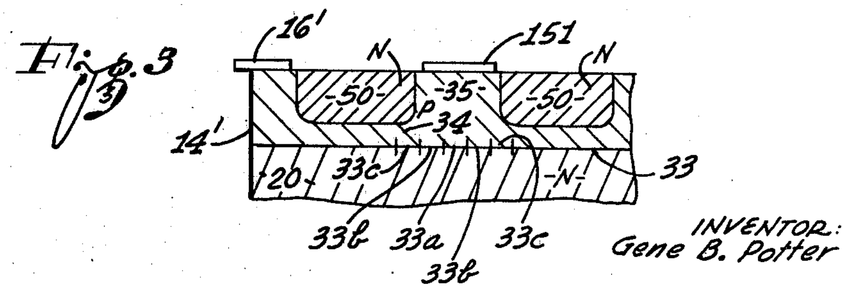
Figure 4:
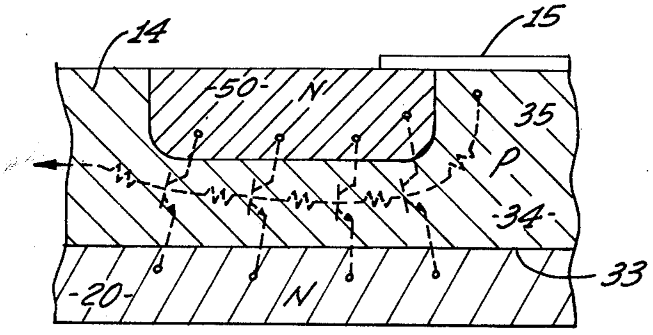
Figure 5A:
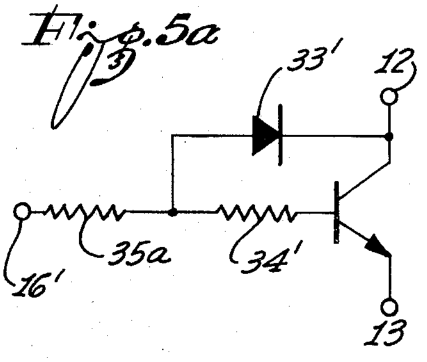
Figure 5B:
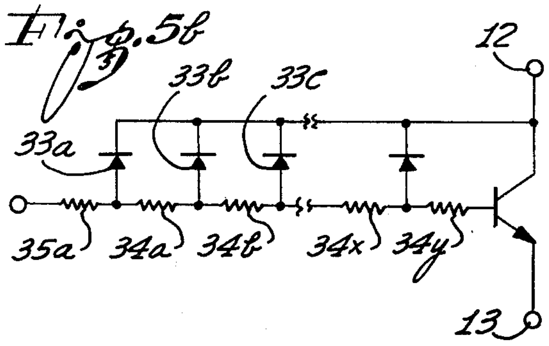

FIGS. 3 and 4 illustrate schematically section views of a portion of the transistor shown in FIGS. 1 and 2, being somewhat modified to explain some basic aspects of the operation and functioning of the transistor in accordance with the invention; and FIGS. *5a*, *5b* and 6 are equivalent circuit diagrams which are very helpful in the understanding of the functioning of the transistor.

Turning now to the detailed description of the drawings, in FIG. 1 thereof there is shown a semiconductor body 10 which, as stated above, may be a portion of an integrated circuit chip. This chip may basically be comprised of a germanium or silicon wafer. The actual manufacturing process of the transistor follows the principles and techniques as they are generally known and the steps required here shall be mentioned only very briefly and to the extent necessary to explain that the inventive concept is in fact capable of realization without requiring special manufacturing steps.

The bottom layer as shown is doped to have P type conductivity. That bottom layer is actually the initial chip which has been cut, for example, from a silicon ingot, and which does not require necessarily further treatment as far as determining and modifying its conductivity is concerned. Silicon ingots from which the thin wafers are cut for this purpose usually have already P type conductivity to the required degree. A thin layer 21 on top of wafer 10 is comprised of silicon heavily doped with arsenic or antimony to assume N+ conductivity. This layer 21 may have been originally a surface stratum of wafer 10 into which doping material has been diffused. Alternatively this layer 21 can be produced by epitaxial growth.

This layer 21 forms a high-conductivity-low-resistivity current path for electric currents parallel to the extension of the chip and caused to flow in the principal stratum or thin film 20. This layer 20 is also of N type conductivity and will form the collector zone in the transistor ultimately to be produced. Layer 20 has been produced also by epitaxial growth as a thin film on top of wafer 10.

Layer 20 has been grown initially over the entire wafer surface as a contiguous layer of uniform type conductivity, namely, N type. Subsequently an array of border zones 11 are created by diffusing into layer 20 a substance establishing P type conductivity, for example, boron, so that islands 21 of N type conductivity are set up which are isolated from each other by a lattice type structure formed by the interconnected zones 11. These blocks of N type conductivity constitute individualized circuit components in the same film. As stated, these zones 11 are heavily doped, P+ type conductive regions, and the diffusion, of course, has to extend down and into the wafer 10 to fully traverse layer 20, as originally grown to provide these individual islands or blocks.

All the various zones and regions for an individual circuit elements such as a transistor to be formed subsequently will be contained within the bounds of that N type conductive block, isolated from the remaining portion of the chip by the P zones 11 and by the original wafer 10. The term "isolated" can be used correctly here because the PN junction between zones 10, 11 on one hand and on the other hand 20 will be usually reversely biased, so that the connection between the islands is very high ohmic. In the following we shall call this block or island 21 as bounded by the zones 11 and 10 and by the upper exposed surface of the epitaxially formed N conductivity type layer 20, the transistor body. It is understood, that as a discrete element it would be a part by itself, but in an integrated circuit configuration it is just an isolated portion or island of and within the integrated circuit chip.

There is next provided a very heavily doped N+ conductive surface region 25 as part of the zone 20 but having low resistivity and making ohmic contact with a collector contact lead 12. The heavy doping of phosphorus in zone 25 prevents here the formation of an undesirable additional PN junction of the silicon body with the contact lead 12, made, for example, of aluminum.

By diffusing, for example, boron, into a portion of the originally N conductive transistor body as bounded by the zones 10 and 11, as P conductive type zone is created therein. This subsequently created P conductive zone as a whole is denoted with reference numeral 30. The P zone 30 sets up a contiguous boundary or PN junction with the N zone 20. This junction has a portion 31 which extends substantially down from the surface of the transistor body and is rather close to the heavily doped collector portion 25 and thus rather close to the collector output lead. The PN junction between zones 20 and 30 has, furthermore, a portion 32, which is contiguous with portion 31, but it extends essentially coplanar with the wafer 10 and in the vicinity of what will be described below as being the emitter zone 40. Furthermore, there is a portion 33 of the PN junction presently described which portion is also contiguous with the portion 32 but which is characterized by remoteness from the emitter zone 40.

The contiguous junctions 31 and 32 together constitute the base-collector diode of the transistor and junction 33 is an additional diode which can be regarded as being, to some extent, electrically connected in parallel with the base collector diode, but which does not participate in the transistor operation proper.

As stated above, there is an impurity concentration gradient in the P zone 30 in that the conductivity near the surface is relatively high and decreases toward the junctions 31, 32 and 33. Thus the P type zone 30 has a very low conductivity in the vicinity of junction 32 and 33 and defines a region 34 of low conductivity particularly in the vicinity of junction 33.

By another diffusion step, another N conductivity type zone of limited dimension has been created in the P zone 30 which is the emitter zone 40 having a PN junction 41 with a P zone 30. Preferably phosphorus will be used here for doping. As one can see from the top view of FIG. 2 there are actually two emitter zones which provision improves the geometry of the system, for reasons to be described more fully below. An emitter electrode lead 13, also made of aluminum, makes ohmic contact (double contact) at the surface with the zones 40.

The basic transistor thus is established by the following regions or zones: The collector zone proper which is the region 26 extending in the vicinity of the junction 31, 32 and in vicinity of zone 25. It is, so to speak, a portion of the N type conductivity zone 20 which has minimum distance as between the PN junction 31 and the input lead 12. The small zones 40, as a whole, are the emitter zone. The base zone proper of the transistor is denoted with reference numeral 36 and encompasses the region of minimum resistance between junction 41 and junction 31–32. The minority charge carrier diffusion process occurs predominantly in and through this region 36.

The dashed line 14 denotes an artificially assumed, internal border. The portion of P type zone 30 to the right of border 14, is denoted with reference numeral 34 and, as was already mentioned, constitutes a resistor. It is, in fact, a base input resistor for the transistor and is contiguous with the base zone 36 thereof. The exact location of the border 14 is impossible to draw, nor would it be meaningful to do so. To the left of the border 14 is that portion 36 of the P zone 30 which constitutes the base zone proper. In reality, of course, the diffusion process through the base zone gradually decreases with its distance from the emitter zone and in a direction away from the collector lead in zone 25. It is thus assumed that to the right of border 14 this particular minority charge carrier diffusion process (between emitter and colector zones) is negligibly low.

The portion of zone 30 to the right of border 14 can be considered, in terms of an equivalent, as being a separate circuit element, namely, a resistor (34). This border 14 is thus plotted only for convenience of explaining the function of the transistor in terms of phenomena predominantly occurring to the left and to the right thereof, but the border does not exist as a physical boundary. The immediate operation of the transistor as controlled at its base is, in fact under the exclusive control of the events which transpire to the right of that border 14 but in internal contiguity with the base zone proper 26.

It will be convenient to speak of the PN junction 31 and 32 to the left of the border 14 as the collector-base diode of the transistor whereas the junction 33 is the bypass diode. In reality again, this distinction is based on the assumption already mentioned that the electron-hole diffusion process will occur only to a negligible extent across that portion 33 of the PN junction to the right of the border 14. On the other hand, junctions 31 and 32 will participate only to a very minor extent in the bypass diode type operation to be explained later which is the predominant and characterizing aspect of that PN junction portion 33. The low ohmic layer 21 can be regarded as a low resistivity connection between the cathode of that bypass diode constituted by the junction portion 33 and the collector proper of the transistor.

The P zone 30 to the right of this assumed border 14 receives, in addition, a ring-shaped N zone 50. This zone 50 is actualy formed during the same diffusion process used to establish the emitter zone 40 and thus involves the same type of impurities. This, however, is only a convenient manufacturing consideration and not of principal importance. The ring-shaped N zone 50 has a ring trough-shaped boundary with the P zone 30 defining therewith a PN junction of like configuration. That junction has a ring-shaped bottom portion 51, an inner, somewhat cylindrical ring portion 52 and an outer also cylindrical ring portion 53 of larger diameter. The portion of the P zone 30 circumscribed by that ring is denoted with reference numeral 35 and has a comparatively high conductivity. Underneath ring 50 extends now the low conductivity zone 34. Zone 50 has a width and a depth so that any current flowing from the surface of the central region 35 into that region 34 has to flow through the region 34 unless the potential distribution established in the region 34 permits passage of some curent across the PN junction 33.

A circular contact piece 15 makes ohmic contact with the surface of the P zone portion 35, but it also makes contact wth a portion of the ring-shaped N zone 50. That contact 15 is the lead-in for the base of the transistor. A conveniently shaped, electrically conductive, metallic contact piece 16 makes contact with the P type zone 30 where exposed all around and adjacent the ring-shaped zone 50 but without making contact therewith and without forming a PN junction. Hence, layer 16 establishes essentially similar potential all over the surface portion of the P zone 30 in contact therewith.

There are no terminals leading from or to this layer 16. In other words, the potential of layer 16 is not subject to external control. Moreover, layer 16 leads all of the current emanating from underneath ring 50 over its entire periphery towards the transistor base zone 36 proper and here particularly into the vicinity of the emitter zones 40. As one can see from FIG. 2, a tongue of this layer 16 extends inbetween the two emitter zones 40 to enhance this conduction of the output current of this resistor 34 and into the base zone 36 in the vicinity of a rather large portion of the emitter zones 40. Thus the electrode layer 16 actually connects this resistor 34 to the base 36 of the transistor proper.

This base current could and does flow to some extent directly across the assumed border 14. Even though the layer 16 is a low ohmic connector for this connection between resistor 34 and base zone 36, it is thus not principally essential due to contiguity of zones 36 and 34. It should be repeated here that the vertical dimensions shown in FIG. 1 are grossly exaggerated in relation to the horizontal dimensions, so that layer 16 materially improves the operation and ensures symmetric current flow through resistor 34 in radial outward direction from the central input zone 35.

It will be observed and should be noted for reasons of sufficient generality, that the border 14 between base zone 36 and the zone defining resistor 34 could, in fact, exist as a physical reality, i.e., as a narrow portion of N conductivity type and being a part of zone 20 to reach the surface between the ring 50 and emitter zone 40, thus physically separating base zone 36 from resistor 34. However, in this case electrode layer 16 would have to pass over the surface of that separating N type zone portion without contacting same. Thus, the physical contiguity of zones 36 and 34 and absence of separation of the base zone 36 from base resistor 34 are an important aspect for economizing the manufacturing of this device.

It follows that, in summary, to the right of the border 14 there is established a pinch resistor. The current destined to control the base of the transistor flows from its external source into the region 35 circumscribed by the ring 50; the current then flows radially outwardly along the portion 34, underneath ring 50, and up again, to be collected by the electrode layer 16 and to be guided into the vicinity of the emitter zones but to flow actually into the base zone 36 of the transistor.

In order to explain the invention it will be convenient to refer to FIG. 3. This figure differs from the transistor configuration shown in FIGS. 1 and 2 by the size of the contact lead-in for the resistor and designated here with reference numeral 151; it contacts only the surface of the central portion 35 of the P zone 30 without making contact with the exposed portion of ring 50. Furthermore, in FIG. 3 the border 14, designated here as 14′, has been given physical reality as a boundary, as the FIG. 3 will be used specifically to explain this diode-resistor combination established by zones 50, 34 and 20. The output terminal 16′ can be regarded as the equivalent of the electrode 16 and it serves as output terminal of this simplified model of the resistor-diode combination as established by the zones 50, 35, 34 and 20. The current in terminal 16′ is the base current for the transistor, and it is the development of that current which will be described next.

In accordance with the model shown in FIG. 3, the voltage and current for the control of the transistor are applied to the connecting piece 15′. It is to be assumed at first that this voltage is rather low to the extent that ultimately the developing base current will not drive the transistor into saturation. As far as total effective transistor base circuit resistance is concerned, that current is defined by the serially combined resistivity of the following zones and regions; zone 35 (which is, in reality, very small); the resistivity of the high ohmic region 34, which can also be referred to as being a resistor 34; and the resistivity of the P zone between the interior region 34 and the surface region adjacent electrode 16', which again is rather small.

The current flowing through the resistor region 34 flows along junction 33. A low input voltage for electrode 15' is now assumed to refer to a voltage having value so that junction 33 is reversely biased, because the N zone portion adjacent junction 33 has essentially collector potential which is above base zone potential for the below saturation operating range. FIG. *5a* shows the equivalent circuit for this situation, with diode 33' being reversely biased by the potential at input electrode 15'. 35a being the equivalent resistor of zone 35, and 34' is the equivalent resistor of zone 34.

If it is assumed now that the voltage applied to the electrode 15' is greatly increased to operate the transistor at saturation, this causes the extended base-collector junction to become forward biased and the collector voltage applied to the principal transistor to drop. In this case the voltage, as effective in the zone 35, and the potential all along the PN junction 33 will be above the collector potential, and most of the current flowing into electrode 15' will pass across and through the PN junction 33, and from there predominantly along layer 21 to the collector zone proper 26. The current crossing junction 33 and flowing into the collector zone will participate in the total transistor current flow. The current balance at the collector is such that the bypass current crossing junction 33 into the collector zone joins the current flowing from the collector terminal 12 and the base 36 to comprise the total current flowing through the base and into the emitter 40. The collector-emitter current is, of course, essentially constant at saturation conditions so that the exernal collector load current is diminished accordingly.

Thus it can be seen that the extended base collector junction has the effect of bleeding off substantially all overdrive current except that needed for saturation. This bleeding occurs at a point along the extended base-collector junction physically removed from that portion of the junction which forms the base-collector junction of the principal transistor. As a result, the minority carrier accumulation occurring from excess current flow across a forward biased junction will occur at a location sufficiently far removed from the base zone of the principal transistor so that it will have only minimal effects on the storage time and other characteristics of the transistor. It should be noted that the device is self regulating so as to keep the transistor just at the edge of saturation without allowing excess overdrive. As long as the transistor remains saturated the only current driving it is that current flowing through pinch resistor 34' attributable to the forward voltage drop across diode 33'. It should be noted that if the transistor tended to drop out of saturation the forward voltage across diode 33' would decrease, up to the diode reverse breakthrough voltage, until it drove the transistor back into saturation.

The equivalent circuit shown in FIG. *5a* suffices only to explain the extreme case of an underdriven transistor, but not for saturation and variable overdrive of the transistor. Since the inventive structure is intended for operation under both saturated and non-saturated conditions another equivalent circuit is needed for describing its operation under saturated conditions. The equivalent circuit shown in FIG. *5b* is a more suitable representation of equivalency for transistor saturation and variable overdrive conditions. The base input resistor is shown in FIG. *5b* as being subdivided into a plurality of incremental series resistors 34a, 34b . . . 34x, 34y. To this again the resistance value 35a is added serially. The PN junction 33 can be considered as being subdivided into an incremental central portion 33a and concentrical ring portions of increasing diameter 33b, 33c, etc. Each of them can be regarded as an incremental diode and the anodes of these incremental diodes are serially interconnected by the incremental resistances 34a, 34b, etc.

The incremental diodes in the circuit are located progressively remote from the input side of the resistor 34 which is the region 35. The anode current for each incremental diode must traverse first at least a portion of the resistor 34. The diode formed in the vicinity of boundary 14' has its anode essentially connected to electrode 15' through the entire resistor 34.

One can readily see that with a variable potential applied to electrode 15' the junction 33 bleeds off increasing amounts of excess current towards the collector so that the current which actually reaches the base 36 increases only very minutely. The potential of electrode 16' cannot exceed much (in positive direction) the forward voltage of junction 33 plus the collector potential which, in turn, determines the current through electrode 16'. The base potential relative to the collector is essentially now determined by the forward voltage drop of junction 33 and thus follows the load conditions for the collector current. Hence, variations in the control voltage applied to electrode 15' result in only slight variations in the voltage across resistor 34' or the entire resistor region 34 in so that the current flowing into the base 36 of the principal transistor changes very little due to the, so to speak, lateral flow-off of current from resistor 34' across PN junction 33. These phenomena limit the base current to values insufficient to establish excessive minority charge current densities in the base zone 36.

It is an added convenience that the entire bypass diode as thus formed by the PN junction 33 has precisely the same characteristics as has the collector-base diode 31–32 of the transistor itself because actually only one contiguous junction is involved. The junctions have been formed by the same diffusion process and thus have inherently the same characteristics everywhere. This is more than an important manufacturing consideration as it provides inherently matching conditions for the transistor and its bypass diode. For example, the temperature dependency of that diode, on the one hand, and of the collector-base diode on the other hand, are similar for the same reason. In particular the temperature characteristics of the amount of excess current to be bled off as is necessary under the operating circumstances at any instant is automatically adjusted to variable temperature conditions affecting the transistor operation as a whole. Also PN junction 33 becomes forward biased at the same time as the base-collector junction 31 of the principal transistor thus causing the current bleeding to occur simultaneously with saturation.

It will be appreciated that the transistor device as described, particularly having an electrode 15' as illustrated in FIG. 3 operates satisfactorily, so that the larger size electrode 15 contacting also region 50 is not an essential provision in principle. However, one aspect of the device shown in FIG. 3 has not yet been considered. The portions of the N type zone 50 bordering the P type zones 35 and 34 are at approximately the same potential as the adajcent portions of these P zones. Thus the top portion of N zone 50 is at approximately the same potential as zone 35 and higher than the potential of zone 34. I should be noted that the zones 50, 34 and 20 constitute a transistor and because of this potential difference there is a slight transistor effect which can be accentuated by the addition of the electrode 15 to overlap the surfaces of P zone 35 and N zone 50. This transistor effect can be beneficial for the inventive purposes, including superior transient characteristics, if the zones are operated as an auxiliary transistor in a particular manner as described below.

Figure 6:
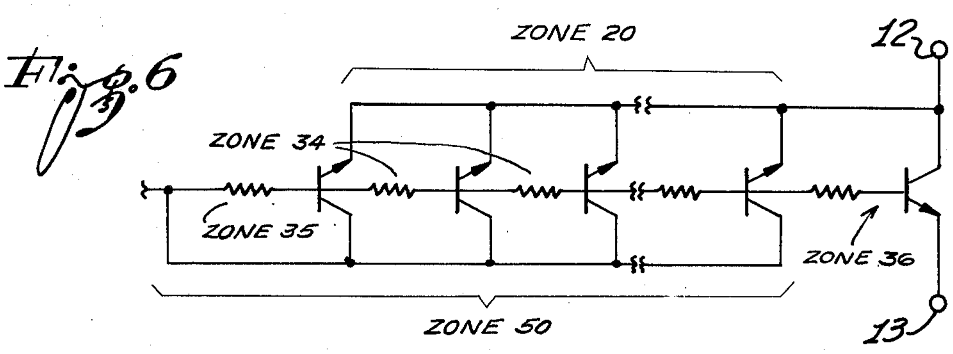

In view of the geometry and particularly because of the impurity gradient of the P zone in the high resistance portion 34, it is actually more correct to speak of a plurality of incremental transistors or one could speak also of a distributed transistor. The incremental diodes 33a, 33b, 33c, etc., as described above are individual base-emitter diodes in this model, and they pertain respectively to this plurality of incremental transistors. The zones 35 and 34 when subdivided, on one hand, define the respective bases of such incremental transistors as far as conduction of current from the emitter 50 to the collector 20 is concerned. But, on the other hand, for current flowing along the junction 33 through that resistor 34 the distributed resistivity thereof defines a plurality of incremental resistors which sequentially connect the base electrodes of the incremental transistors in series, and which as series circuit connection still define the base circuit input resistor for the principal transistor of this device as constituted by zones 20–36–40. The NPN configuration of zones 50–35, 34–20 as defining such distributed transistor is illustrated in FIG. 4 and on a somewhat enlarged scale. The figure shows also in dotted lines the equivalent circuit of that configuration. The full equivalent circuit of the entire device is shown in FIG. 6.

It should be noted that the auxiliary distributed NPN transistor is operated in an unusual manner. The distributed transistor will operate in a common emitter configuration with base control, but the N zone in this integrated circuit structure which is normally used as an emitter will be used as a collector and the N zone normally used as a collector will be used as an emitter. As a result the characteristics of the distributed transistor will be different than they would if the NPN transistor junctions were hooked up in the normal manner. Thus PN junction 34–50 is the base-collector junction and will be reverse biased at all times and PN junction 34–20 is the base-emitter junction and is forward biased when the principal transistor is saturated. The distributed transistor 50–34–20 is not driven at saturation because the base-collector junction always remains reverse biased as described below.

The distributed auxiliary transistor has a collector voltage equal to the control voltage because control current electrode 15 overlaps the collector 50. The base voltage is less than the collector voltage by the amount equal to the voltage drop across resistive segment 35 of the P material and as a result the distributed transistor can never saturate. Since the base-emitter junction 33 of the distributed transistor is continguous with the base-collector junction 31 of the principal transistor, the voltage on the emitter of the former is substantially the same as the collector voltage on the latter. Note that a single junction which has been previously referred to as an extended base collector junction is actually operating at one end as a base-collector junction for the principal transistor and at the other end as a base-emitter junction for the distributed auxiliary transistor. Thus the emitter voltage of the distributed transistor is high when the principal transistor is not saturated and low when the principal transistor is saturated since saturation causes the principal transistor collector voltage to drop. When the principal transistor is saturated its base-collector junction is forward biased and since as a result of voltage drop in the pinch resistor 34 the base control voltage applied to the base of the distributed transistor is greater than the base voltage at the principal transistor, the base emitter junction of the distributed transistor (i.e., the elongated extension of the base-collector junction of the principal transistor) is also forward biased and conducting heavily.

It should be noted the voltage applied to the first base increment of the distributed transistor is the control voltage less the voltage drop in P zone 35. However, the voltage applied to the next increment once junction 33 is forward biased is the forward voltage drop across the first increment of this junction when forward biased less the drop in the next increment of pinch resistor 34. The voltage applied to the next increment after that is the forward voltage drop across the preceding increment of junction less the next increment of pinch resistor 34, etc. Thus, it can be seen that the current reaching the base of the principal transistor is a function of a very small voltage and hence remains at a small value regardless of the variation in the control current and voltage. This same result is reached with certain disadvantages when the overlapped control electrode 15 is not present and the pinch resistor junction 50–34–20 is not connected as a distributed transistor. In this case the increments of diode junction 34–20 are the bypass for saturation of the principal transistor and each incremental diode has a voltage equal to the forward voltage of the previous incremental diode less the voltage drop across the next increment of pinch resistor 34. The same is true for each incremental diode.

In operation this distributed transistor will have increasing amounts of base-emitter currents as the base voltage increases. Since the base-emitter junction 33 of this distributed transistor is an elongated extension of the base-collector junction of the principal transistor, the base emitter current will add to the collector-emitter current of the principal transistor. When the principal transistor reaches saturation its base-collector junction ***e*1 will become forward biased as will the base-emitter junction 33 of the distributed transistor and the base-emitter current of the distributed transistor will increase greatly as each increment of this junction acts as a by-pass for the control current applied to electrode 15**.

It can be seen that the collector-emitter current of the principal transistor will consist of the current drawn from the collector voltage source plus the base-emitter current plus the base-emitter current of the increments of the distributed transistor and the collector-emitter current of the increments of the distributed transistor. Most of the control current is by-passed as base-emitter current of the distributed transistor with small amounts appearing as collector-emitter current of the distributed transistor and as the control current passing through the distributed pinch resistor 34 to control the base of the principal transistor.

Varying amounts of control current appearing at electrode 15 will cause the base-emitter current and collector-emitter current of the increments of the distributed transistor to vary so that greater amounts of current are by-passed for larger control currents than for small control currents, thus reducing overdrive of the principal transistor. The use of overlapping electrode 15 to make a distributed transistor out of a distributed diode, and the use of electrode 16 to carry the principal transistor base current from the pinch resistor to the principal transistor, have additional beneficial effects on the transient response of the inventive structure since they tend to eliminate capacitance effects inherent in the structure which could cause problems with transients.

It is to be understood that the above described arrangements are illustrative of the application of the principles of the invention. Numerous other arrangements within the scope of the invention may be devised by those skilled in the art. Thus by way of example and not by limitation other arrangements may be made using integrated circuit techniques to deposit semi-conductor material on a chip with matched saturation, regulation, control, resistance and temperature characteristics so as to cause any accumulations of minority charge carriers resulting from excess control current to occur at locations dispersed from the base of the principal transistor so as to reduce their effect on the base of the transistor and reduce storage time and accordingly improve other characteristics. Accordingly, from the foregoing, it is evident that various changes may be made in the present invention without departing from the spirit of the invention as defined in the appended claims.

What is claimed is:

1. A transistor wherein in a semiconductor body there is a first region of a first conductivity type and constituting the base zone of the transistor, and wherein there are second and third regions each being contiguous with the first region to form the N junctions therewith and being separated from each other by the first region, the second and third regions respectively constituting the emitter and the collector zone of the transistor and both of them being of a second conductivity type opposite to the first conductivity type, the improvement comprising:

a fourth region in said body having the same conductivity as said second and third regions and establishing a PN junction with the first region to define a pinch resistor which includes a resistive path through a portion of the first region along the PN junction between the first and the third region in the vicinity of said fourth region but remote from the emitter-collector path as defined between the third and the second region, which emitter-collector path traverses the first region remote from said fourth region, said first region between said fourth region and said PN junction between the first and the third regions having a relatively low conductivity; and first, second and third contact means respectively making ohmic contact with the first, second and third regions, the first contact means making contact with the first region in the vicinity of the fourth region remote from said emitter-collector path.

2. A transistor as set forth in claim 1, said first contact means making ohmic contact with the fourth and first regions.

3. A transistor as set forth in claim 1, said fourth region having a ring-shaped configuration circumscribing a portion of the first region in contact with the first contact means.

4. A thin film transistor wherein the film has a first predominant type conductivity except in discrete regions where that conductivity has been changed, the regions of unchanged conductivity of the film defining the collector zone of the transistor;

a base zone in the film being of opposite type conductivity to form an interior PN junction with the collector zone, and having an exposed surface;

an emitter zone in the base zone of the film, being smaller than the base zone and having also an exposed surface;

a ring-shaped zone in the base zone of the film, having a ring-shaped exposed surface and a ring-trough shaped PN junction with the base zone, the bottom of the trough extending in the vicinity of the PN junction between base and collector zones; and three contact means, a first one making ohmic contact with an exposed surface portion of the collector zone, a second one making ohmic contact with an exposed surface portion of the emitter zone, and the third one making ohmic contact with the exposed surface portion of the base zone where surrounded by the ring-shaped surface of said ring-shaped zone.

5. A transistor as set forth in claim 4, there being an electrode layer on the surface of the exposed surface of the base zone, except where contacted by the third contact element, the electrode layer and the third contact element being isolated from each other.

6. A transistor as set forth in claim 4, said third contact element contacting also a portion of the exposed surface of the ring-shaped zone.

7. A transistor as set forth in claim 4, said base zone having a gradient in impurity carriers with decreasing concentration of the impurity carriers from the surface down towards the PN junction with the collector zone.

8. A thin film transistor wherein the film has a first predominant type conductivity except in discrete regions where that conductivity has been changed, the regions of unchanged conductivity type of the film defining the collector zone of the transistor;

a base zone in the film of opposite type conductivity having an interior PN junction with the collector zone and an exposed surface;

an emitter zone in the film surrounded by the base zone, being smaller than the base zone and having also an exposed surface;

an additional zone in the film and forming a PN junction with the base zone and having a particular exposed surface which completely surrounds a limited portion of the surface of the base zone, the latter PN junction extending to the vicinity of the PN junction between base and collector zones; and three contact elements, a first one thereof making ohmic contact with an exposed surface portion of the collector zone, a second one thereof making ohmic contact with an exposed surface portion of the emitter zone, and the third one making ohmic contact with said completely surrounded surface portion of the base zone.

9. A transistor wherein in a semiconductor body there are different and distinct regions of opposite type conductivities, comprising:

a first region of a first conductivity type constituting the base zone of the transistor;

a second and a third region in the semiconductor body, each being contiguous with the first region to form PN junctions therewith and being separated from each other by the first region, the second and third regions respectively constituting the emitter zone and the collector zone of the transistor and both of them being of the second conductivity type opposite to the first conductivity type;

a fourth region in said body having the same conductivity as said second and third regions and establishing a PN junction with the first region, said fourth region having an exposed surface portion of a configuration which completely circumscribes a limited surface portion of the base zone, the PN junction between the fourth region and the base zone extending into the vicinity of the PN junction between the collector zone and the base zone; and first, second and third contact means respectively making ohmic contact with the first, second and third regions, the first contact means making contact with the base zone at the exposed surface portion circumscribed by the exposed surface of the fourth region.

10. A semiconductor device comprising:

a semiconductive body having a first zone of particular type conductivity and constituting the collector zone;

a second zone of opposite type conductivity and forming a PN junction with the first zone;

a third zone also of opposite type conductivity, also forming a PN junction with the first zone and being conductively connected to the second zone through nonrectifying, ohmic type connection;

at least one fourth zone in the second zone and of the same conductivity as the first zone but separated from the first zone by this second zone, and forming a PN junction with the second zone to constitute an emitter zone;

a fifth zone in the third zone being of the same conductivity type as the first and fourth zones but separated from them by the third zone, the third zone being conductively connected to the second zone near a first particular portion of the fifth zone; and a plurality of means for individually making ohmic nonrectifying contact with the first, third and fourth zones, the ohmic contact with the third zone being made at a particular location of the third zone displaced from the first particular portion of the fifth zone so that the current between the means contacting the third zone and the second zone runs through a portion of the third zone, which extends between the PN junction of the third and fifth zone and the PN junction of the third and the first zone.

11. A transistor as set forth in claim 10 wherein the fifth zone has a ring-shaped configuration.

12. A transistor as set forth in claim 11, said second and third zones being contiguous and having exposed surfaces, the fourth and the ring-shaped fifth zone each having also an exposed surface for respective ohmic connection with the electrode means, there being an electrode layer on the exposed surface of the second and third zones and having a configuration to extend to the vicinity of the respectively exposed surfaces of the fourth and fifth zones and contacting neither of them.

13. A semiconductor device as set forth in claim 10, the means for making contact with the third zone also making contact with the fifth zone.

14. A transistor as set forth in claim 13 wherein the fifth zone has a ring-shaped configuration.

15. A semiconductor device wherein in a semiconductive body are provided emitter, base, and collector zones to establish a transistor configuration, the base zone having an extended portion beyond the region participating to a substantial degree in the minority charge carrier diffusion, the base zone including the extended portion forming a PN junction with the collector zone, and electrode means for feeding current to the extended base zone at a location remote from said region, the location being in the vicinity of the portion of the PN junction near the extended base zone and additional zone defining means establishing another PN junction with the extended portion, in the vicinity of the PN junction of the extended portion with the collector zone, to define a confined current path for the current towards but outside of said region.

16. In a semiconductor device having a zone of particular conductivity for providing a diffusion path for minority charge carriers through the zone, the zone having an extended portion and defining an extended PN junction together with a second zone of opposite polarity type conductivity, and extending from the diffusion path for minority charge carriers to a location remote therefrom, and means for making ohmic contact with the extended portion of the first zone in the vicinity of a portion of the extended PN junction for supplying current to the diffusion path, the extended portion having a configuration so that the current therethrough runs along said extended PN junction in locations remote from the diffusion path but leading along the extended PN junction into the diffusion path; and means for confining the current path for the current in the remote locations to the vicinity of the PN junction.

17. A semiconductor device comprising:

a semiconductive body having a first zone of particular type conductivity;

a second zone of opposite type conductivity and forming a PN junction with the first zone;

a third zone also of opposite type conductivity also forming a PN junction with the first zone and being conductably connected to the second zone through non-rectifying, ohmic type connection;

at least one fourth zone in the second zone and of the same conductivity as the first zone but separated from the first zone by the second zone, and forming a PN junction with the second zone; and a plurality of means for individually making ohmic non-rectifying contact with the first, third and fourth zones, the ohmic contact with the third zone being made at a particular location of the third zone so that the current flowing through the means contacting the third zone and the second zone runs through the third zone in a path adjacent the PN junction of the third and first zone.

18. A semiconductor device as set forth in claim 17 wherein the third zone has a high resistance relative to the resistance in the forward direction of the PN junction formed by said third and first zones.

19. A semiconductor device as set forth in claim 17 including pinch means for causing the current flowing through the means contacting the third zone and second zone to flow through a high resistance portion of said third zone.

20. A semiconductor device as set forth in claim 19 wherein said pinch means includes a fifth region of opposite conductivity from said third zone and embedded in said zone.

21. A semiconductor device as set forth in claim 20 including means for making the PN junction between said third and fifth zones form a high resistance barrier to current flowing in said third zone.

22. A semiconductor device wherein a semiconductive body is provided with emitter, base and collector zones to establish a transistor configuration, the base and collector zones each having an extended portion for forming an extended PN junction and means including a zone spaced apart and separated from the emitter and collector zones but having similar type conductivity as the emitter and collector zones, for establishing a restricted current path in the interior of the semiconductive body through the extended portion of the base zone along the extended PN junction and toward the base zone proper in the vicinity of the emitter zone, thereby defining a pinch resistor integral with the base zone.

References Cited

UNITED STATES PATENTS

| | | | |
|---|---|---|---|
| 2,754,431 | 7/1956 | Johnson | 307—88.5 |
| 2,800,617 | 7/1957 | Pankove | 317—235 |
| 3,220,896 | 11/1965 | Miller | 148—33.5 |
| 3,226,614 | 12/1965 | Haenichen | 317—234 |
| 3,289,267 | 12/1966 | Ullrich | 29—25.3 |
| 3,390,280 | 6/1968 | Thompson | 307—215 |
| 3,393,349 | 7/1968 | Huffman | 317—101 |

JAMES D. KALLAM, Primary Examiner

S. BRODER, Assistant Examiner

U.S. Cl. X.R.

148—1.5